(12) United States Patent
Jeon

(10) Patent No.: US 8,715,006 B2
(45) Date of Patent: May 6, 2014

(54) CIRCUIT BOARD HAVING PLATED THRU-HOLES AND GROUND COLUMNS

(75) Inventor: Myoungsoo Jeon, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 135 days.

(21) Appl. No.: 13/493,632

(22) Filed: Jun. 11, 2012

(65) Prior Publication Data

US 2013/0330941 A1    Dec. 12, 2013

(51) Int. Cl.
*H01R 13/648* (2006.01)

(52) U.S. Cl.
USPC .................................................. 439/607.1

(58) Field of Classification Search
USPC ................ 439/607.1, 607.05–607.15, 608; 361/792–795, 788
See application file for complete search history.

(56) References Cited

U.S. PATENT DOCUMENTS

| | | | | |
|---|---|---|---|---|
| 2,066,876 A * | 1/1937 | Carpenter et al. | ............ | 361/826 |
| 4,054,939 A * | 10/1977 | Ammon | ........................ | 361/792 |
| 5,215,473 A * | 6/1993 | Brunker et al. | ............... | 439/108 |
| 5,924,899 A * | 7/1999 | Paagman | ...................... | 439/701 |
| 6,137,064 A * | 10/2000 | Kiani et al. | .................... | 174/266 |
| 6,290,532 B1 * | 9/2001 | Vermeersch et al. | ........ | 439/460 |
| 6,353,540 B1 * | 3/2002 | Akiba et al. | ................... | 361/794 |
| 6,384,341 B1 * | 5/2002 | Rothermel et al. | ........... | 174/255 |
| 6,388,208 B1 * | 5/2002 | Kiani et al. | .................... | 174/266 |
| 6,407,344 B1 * | 6/2002 | Horiuchi et al. | .............. | 174/261 |
| 6,409,543 B1 * | 6/2002 | Astbury et al. | .......... | 439/607.07 |
| 6,527,588 B2 * | 3/2003 | Paagman | ................. | 439/607.11 |
| 6,534,872 B1 * | 3/2003 | Freda et al. | .................... | 257/774 |
| 6,593,535 B2 * | 7/2003 | Gailus | ........................... | 174/262 |
| 6,594,128 B2 * | 7/2003 | Anthony | ......................... | 361/56 |
| 6,603,646 B2 * | 8/2003 | Anthony et al. | ................ | 361/56 |
| 6,794,578 B2 * | 9/2004 | Bracaleone | ............ | 174/117 FF |
| 6,873,513 B2 * | 3/2005 | Anthony | ...................... | 361/118 |
| 6,894,884 B2 * | 5/2005 | Anthony et al. | .............. | 361/118 |
| 6,972,382 B2 * | 12/2005 | Zollo et al. | .................... | 174/262 |
| 7,019,219 B2 * | 3/2006 | Bracaleone | ............ | 174/117 FF |
| 7,045,897 B2 * | 5/2006 | Egitto et al. | .................. | 257/759 |
| 7,069,646 B2 * | 7/2006 | Duxbury et al. | ............... | 29/830 |
| 7,121,889 B1 * | 10/2006 | Jeon | .......................... | 439/607.1 |
| 7,239,526 B1 * | 7/2007 | Bibee | ............................ | 361/788 |
| 7,326,643 B2 * | 2/2008 | Desai et al. | ................... | 438/623 |
| 7,365,435 B2 | 4/2008 | Brown | | |
| 7,368,667 B2 | 5/2008 | Brown | | |
| 7,438,581 B1 * | 10/2008 | Jeon | .............................. | 439/342 |
| 7,501,586 B2 * | 3/2009 | Wig et al. | ...................... | 174/262 |
| 7,651,336 B2 * | 1/2010 | Yasumura et al. | ............. | 439/65 |
| 7,675,729 B2 * | 3/2010 | Anthony et al. | .............. | 361/118 |

(Continued)

*Primary Examiner* — Amy Cohen Johnson
*Assistant Examiner* — Vladimir Imas

(57) ABSTRACT

A circuit board including a board substrate having opposite first and second sides. The board substrate has a thickness measured along a z-axis that is perpendicular to the first and second sides. The circuit board also includes plated thru-hole (PTH) vias extending along the z-axis from the first side into the board substrate. The PTH vias are arranged to form multiple signal pairs. The circuit board also includes signal traces that are directly coupled to the PTH vias and extend perpendicular to the z-axis in the board substrate. The signal traces and the PTH vias are configured to transmit differential signals. The circuit board also includes ground columns that extend along the z-axis in the board substrate. The ground columns are distributed relative to the signal pairs to form shield arrays. Each of the shield arrays surrounds one of the signal pairs, wherein the ground columns comprise microvias.

20 Claims, 8 Drawing Sheets

(56) References Cited

U.S. PATENT DOCUMENTS

| | | |
|---|---|---|
| 7,705,247 B2 | 4/2010 | Kim et al. |
| 7,856,706 B2 | 12/2010 | Kumar et al. |
| 7,897,880 B1 * | 3/2011 | Goergen et al. ............... 174/262 |
| 7,935,896 B2 * | 5/2011 | Morlion et al. ............... 174/262 |
| 7,999,192 B2 * | 8/2011 | Chan et al. .................... 174/262 |
| 8,044,305 B2 | 10/2011 | Cai et al. |
| 8,119,931 B1 * | 2/2012 | Liu ................................ 174/262 |
| 8,142,236 B2 * | 3/2012 | Fedder et al. ................. 439/751 |
| 8,168,891 B1 * | 5/2012 | Goergen et al. ............... 174/258 |
| 8,183,466 B2 * | 5/2012 | Morlion et al. ............... 174/261 |
| 8,304,659 B2 * | 11/2012 | Goergen ....................... 174/258 |
| 8,383,951 B2 * | 2/2013 | Morlion et al. ................ 174/261 |
| 8,430,691 B2 * | 4/2013 | Davis ....................... 439/607.09 |
| 8,469,720 B2 * | 6/2013 | Gulla ............................... 439/65 |
| 8,481,866 B2 * | 7/2013 | Chan et al. .................... 174/262 |
| 8,535,065 B2 * | 9/2013 | Costello et al. ................. 439/65 |
| 8,579,636 B2 * | 11/2013 | Davis et al. ..................... 439/65 |
| 2004/0136168 A1 * | 7/2004 | Duxbury et al. .............. 361/748 |
| 2005/0201065 A1 * | 9/2005 | Regnier et al. ................ 361/720 |
| 2006/0023385 A9 * | 2/2006 | Anthony et al. .............. 361/118 |
| 2007/0019352 A1 * | 1/2007 | Anthony ....................... 361/118 |
| 2007/0091581 A1 * | 4/2007 | Gisin et al. .................... 361/782 |
| 2012/0247825 A1 * | 10/2012 | Wei et al. ...................... 174/266 |

* cited by examiner

US 8,715,006 B2

CIRCUIT BOARD HAVING PLATED THRU-HOLES AND GROUND COLUMNS

BACKGROUND OF THE INVENTION

The subject matter described and/or illustrated in the present application relates generally to a circuit board that is configured to transmit data signals and has an array of conductive vias that include signal vias and ground vias.

Communication systems and networks frequently use electrical connectors having arrays of electrical contacts to interconnect different components of the system or network. For example, in some communication systems, an electrical connector communicatively couples a daughtercard and a backplane (or midplane) circuit board. The electrical connector has a first array of electrical contacts that are engaged to corresponding thru-holes in the daughter card and a second array of electrical contacts that are engaged to corresponding thru-holes in the backplane circuit board. The thru-holes may include signal thru-holes, which transmit data signals, and ground thru-holes, which form a return path for data signals and shield the signal thru-holes from crosstalk.

At least some industries require high-speed data transfer rates (e.g., 10 Gb/s or more). Yet when the data transfer rate is increased, crosstalk between adjacent signal thru-holes is also increased. One method of mitigating the negative effects of crosstalk includes increasing the number of ground thru-holes in the circuit board. For example, one or more ground thru-holes may be positioned between adjacent signal thru-holes. However, increasing the number of ground thru-holes reduces the available area for signal routing. Also, as the number of ground thru-holes is increased, it may be necessary to increase the separation distance between the signal thru-holes (also called pitch) in the circuit board to match impedance. Increasing the separation distance decreases the density of the signal thru-holes in the circuit board.

Accordingly, there is a need for a circuit board that facilitates high-speed data transfer rates without increasing crosstalk.

BRIEF DESCRIPTION OF THE INVENTION

In one embodiment, a circuit board is provided that includes a board substrate having opposite first and second sides. The board substrate has a thickness measured along a z-axis that is perpendicular to the first and second sides. The circuit board also includes plated thru-hole (PTH) vias extending along the z-axis from the first side into the board substrate. The PTH vias are arranged to form multiple signal pairs. The circuit board also includes signal traces that are directly coupled to the PTH vias and extend perpendicular to the z-axis in the board substrate. The signal traces and the PTH vias are configured to transmit differential signals. The circuit board also includes ground columns that extend along the z-axis in the board substrate. The ground columns are distributed relative to the signal pairs to form shield arrays. Each of the shield arrays surrounds one of the signal pairs, wherein the ground columns comprise microvias.

In another embodiment, a backplane connector system is provided that includes an electrical connector assembly having a mounting side that includes an array of electrical contacts. The connector system also includes a circuit board having opposite first and second sides. The circuit board has a thickness that is measured along a z-axis that is perpendicular to the first and second sides. The circuit board includes plated thru-hole (PTH) vias extending along the z-axis from the first side into the circuit board. The PTH vias are arranged to form multiple signal pairs. The electrical contacts mechanically and electrically engage the PTH vias. The circuit board also includes signal traces that are directly coupled to the PTH vias and extend perpendicular to the z-axis in the circuit board. The signal traces and the PTH vias are configured to transmit differential signals. The circuit board also includes ground columns that extend along the z-axis in the circuit board. The ground columns are distributed relative to the signal pairs to form shield arrays. Each of the shield arrays surrounds one of the signal pairs, wherein the ground columns comprise microvias.

DETAILED DESCRIPTION OF THE INVENTION

Embodiments described herein include circuit boards that are configured to transmit data signals in a communication system and connector assemblies including such circuit boards. Particular embodiments are configured for high-speed data transmission (e.g., 10 Gb/s or more). The circuit boards include plated thru-hole (PTH) vias that are electrically coupled to signal traces in the circuit boards. The PTH vias are arranged in pairs. The circuit boards also include ground columns that are configured to shield the pairs of PTH vias from crosstalk.

In particular embodiments, the ground columns are formed from one or more microvias that are electrically coupled to a ground (e.g., a ground plane). The microvias may be blind vias and have diameters that are typically smaller than diameters of the PTH vias. For instance, the diameters of the microvias may be less than 0.4 mm. Microvias may be manufactured through various processes, such as those that are used to manufacture blind vias. For example, microvias may be fabricated in one or more dielectric layers through mechanical drilling or laser drilling (e.g., using UV or $CO_2$ lasers to provide a bore through the dielectric layer). Microvias may also be photo-defined or etched (e.g., chemical (wet) etching or plasma etching) blind vias. Once the microvias are formed, the dielectric layers may then be laminated with other dielectric layers that have (or will have) microvias. In this manner, the microvias from the different dielectric layers may be effectively stacked together to form the ground columns.

Figure 1:
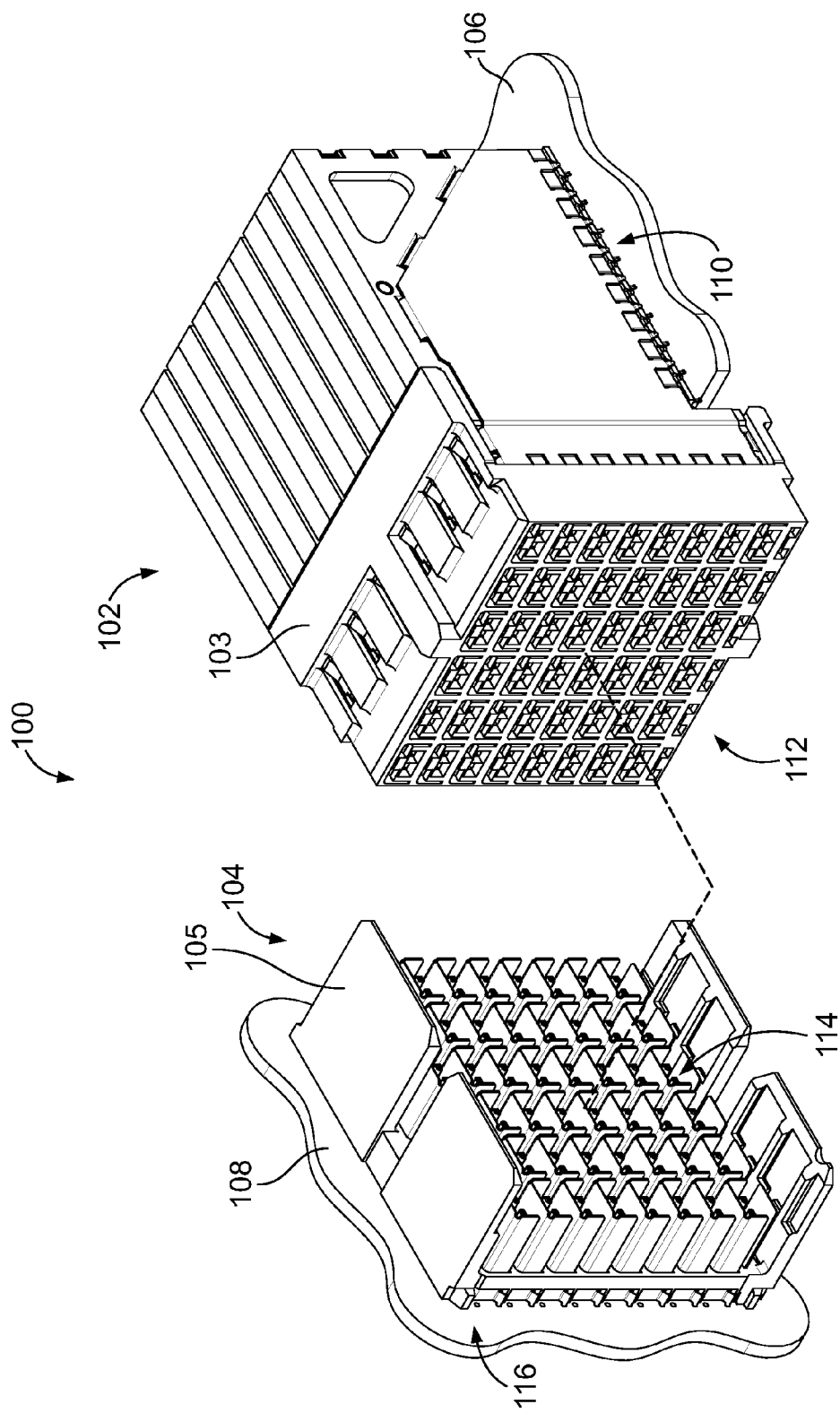
FIG. 1 is a perspective view of a backplane connector system formed in accordance with one embodiment.

FIG. 1 is a perspective view of a backplane connector system 100 formed in accordance with one embodiment. The connector system 100 includes a receptacle assembly 102 and a header assembly 104 that may be directly mated together. Each of the receptacle assembly 102 and the header assembly 104 may be referred to hereinafter as an "electrical connector assembly." The receptacle and header assemblies 102, 104 are each electrically connected to respective circuit boards 106, 108. In the illustrated embodiment, the circuit board 108 may be described as a backplane circuit board, and the circuit board 106 may be described as a daughtercard circuit board (or daughtercard). The receptacle and header assemblies 102, 104 electrically connect the circuit boards 106, 108 to each other at a separable mating interface. In an exemplary embodiment, the circuit boards 106, 108 are oriented perpendicular to one another when the receptacle and header assemblies 102, 104 are mated. However, alternative orientations of the circuit boards 106, 108 are possible in other embodiments.

The receptacle assembly 102 includes a connector housing 103 having a mounting side 110 and a mating side 112. The mating side 112 is configured to mate with the header assembly 104, and the mounting side 110 is configured to be mounted to the circuit board 106. The mounting and mating sides 110, 112 face in orthogonal (or perpendicular) directions. As such, the receptacle assembly 102 may be referred to as a right-angle connector assembly.

The header assembly 104 includes a connector housing 105 having a mating side 114 and a mounting side 116. The mating side 114 is configured to mate with the mating side 112 of the receptacle assembly 102, and the mounting side 116 is configured to be mounted to the circuit board 108. The mating and mounting sides 114, 116 face in opposite directions. As such, the header assembly 104 may be referred to as a vertical connector assembly. In other embodiments, the header assembly 104 may be a right-angle connector assembly and/or the receptacle assembly 102 may be a vertical connector assembly.

In the illustrated embodiment, the connector system 100 is configured to transmit differential signals through pairs of conductive pathways. For example, two signal thru-holes (not shown) in either of the circuit board 106 or the circuit board 108 may form a differential pair. The differential pair of signal thru-holes may transmit signals that are 180° out of phase with each other. A data transfer rate of the connector system 100 may be at least about 10 Gb/s. In particular embodiments, the data transfer rate may be at least about 15 Gb/s or at least about 20 Gb/s or more. However, in other embodiments, the data transfer rate may be less than about 10 Gb/s.

Although not shown, each of the receptacle assembly 102 and the header assembly 104 includes electrical contacts that mechanically and electrically engage the respective circuit boards 106, 108. The electrical contacts may be received by the signal thru-holes. The electrical contacts may be press-fit contacts or compliant pin contacts. As one example, the electrical contacts are eye-of-needle contacts.

Figure 2:
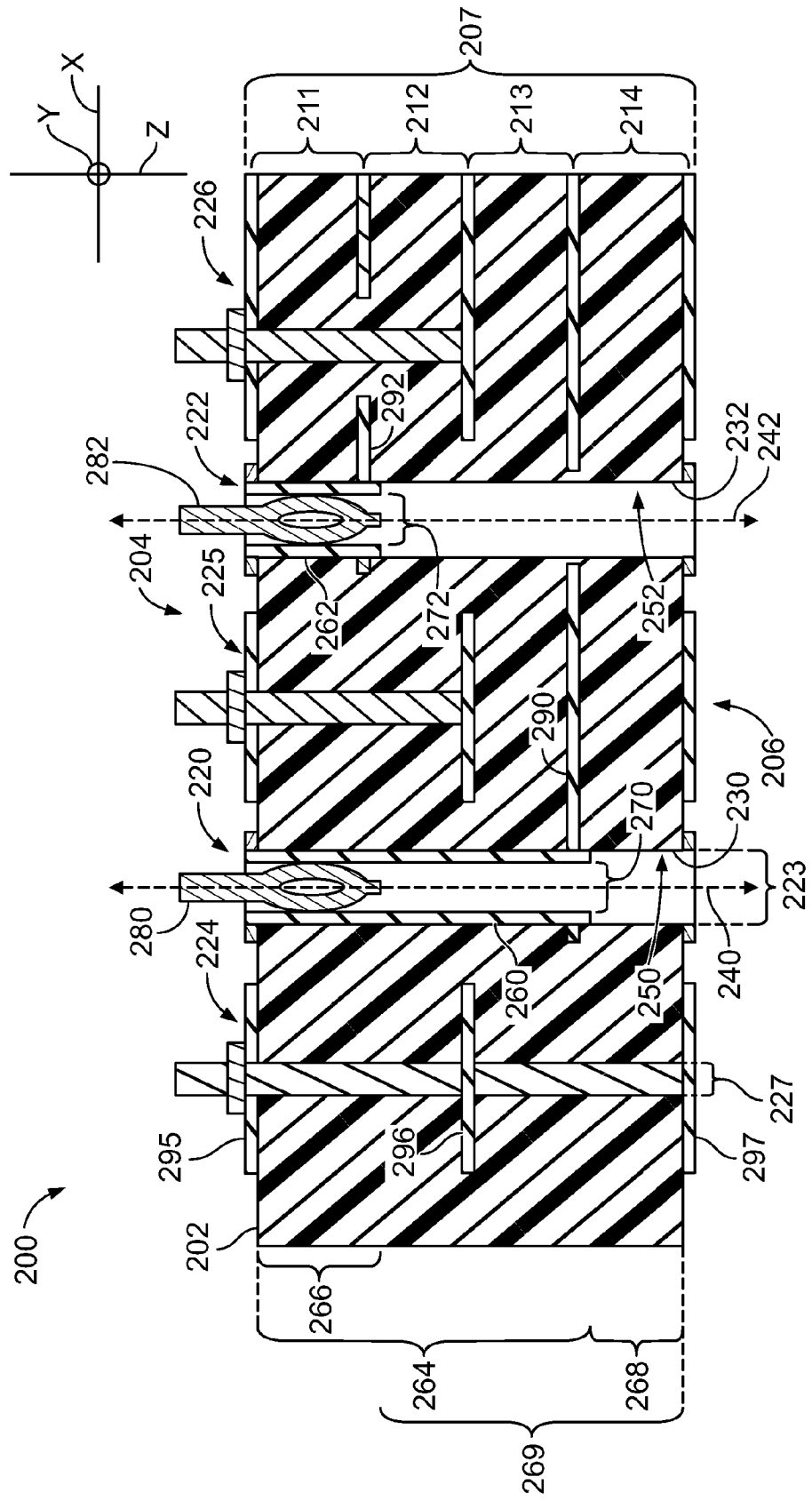
FIG. 2 illustrates a cross-section of a circuit board formed in accordance with one embodiment that may be used with the connector system of FIG. 1.

FIG. 2 illustrates a cross-section of a portion of a circuit board 200 formed in accordance with one embodiment. The circuit board 200 may be used as at least one of the circuit boards 106, 108 (FIG. 1). However, the circuit board 200 may be used with other electrical components or devices, such as those that require a high density of plated thru-hole (PTH) vias for transmitting data signals. As shown in FIG. 2, the circuit board 200 is oriented with respect to mutually perpendicular x-, y-, and z-axes.

The circuit board 200 includes a board substrate 202 having opposite first and second sides 204, 206 that extend parallel to each other. The first and second sides 204, 206 also extend parallel to the x- and y-axes and perpendicular to the z-axis. The first and second sides 204, 206 define a thickness 207 of the board substrate 202 (or the circuit board 200). The thickness 207 is measured along the z-axis. The board substrate 202 includes a plurality of stacked substrate layers 211-214. Although not shown, each of the substrate layers 211-214 may be formed from a plurality of sub-layers. The substrate layers 211-214 may comprise material(s) that are used in printed circuit board (PCB) manufacturing. For example, the substrate layers 211-214 may include a dielectric material, such as a glass-filled epoxy (e.g., FR-4), a thermoset material, or a thermoplastic material.

The substrate layers 211-214 may also include conductive materials that are coupled to the substrate layers 211-214. For example, the circuit board 200 includes PTH vias 220, 222 and ground columns 224-226. The PTH vias 220, 222 extend along the z-axis from the first side 204 into the board substrate 202. In an exemplary embodiment, the PTH via 220 is paired with another PTH via (not shown) to form a signal pair that is used to transmit differential signals. Likewise, the PTH via 222 may be paired with another PTH via (not shown) to transmit differential signals. As such, the circuit board 200 may include multiple signal pairs in which each signal pair comprises two PTH vias that transmit differential signals.

The PTH vias 220, 222 include bores 230, 232, respectively, extending through the thickness 207 of the board substrate 202 from the first side 204 to the second side 206. Each of the bores 230, 232 has a PTH axis (or bore axis) 240, 242, respectively, that extends through a center of the respective bore 230, 232 in a direction that is parallel to the z-axis.

Each of the bores 230, 232 is defined by a corresponding interior surface 250, 252, respectively, that is at least partially plated with a conductive material 260, 262, respectively. In the illustrated embodiment, the conductive material may include copper. As shown, the conductive materials 260, 262 define corresponding contact cavities 270, 272, respectively, of the PTH vias 220, 222, respectively. The contact cavities 270, 272 are sized and shaped to receive and engage electrical contacts 280, 282, respectively. The electrical contacts 280, 282 may be part of an electrical connector (not shown), such as the receptacle and header assemblies 102, 104 of FIG. 1. In the illustrated embodiment, the electrical contacts 280, 282 may be characterized as press-fit contacts that form an interference fit with the conductive material 260, 262, respectively.

In the illustrated embodiment, the bores 230, 232 extend completely through the board substrate 202 such that the bores 230, 232 open to each of the first and second sides 204, 206. However, in alternative embodiments, the bores 230, 232 and the respective PTH vias 220, 222 may extend only partially through the board substrate 202. For instance, during the manufacturing of the alternative board substrate, two substrate layers may be laminated together and drilled to form bores and then plated to form PTH vias. The laminated substrate layers may then be laminated with another substrate layer on one or both sides, thereby covering openings of the bores (or PTH vias). Accordingly, the term PTH via does not require that the bore of the PTH via extend entirely through the board substrate.

In some embodiments, the PTH vias 220, 222 may be back-drilled. For example, after the bores 230, 232 are plated with the conductive materials 260, 262, respectively, the conductive materials 260, 262 may extend along an entire length of the bores 230, 232. When a PTH via is back-drilled, a portion of the plated conductive material along an interior surface of the bore is removed using, for example, a drilling process. After backdrillling, the PTH vias are only partially plated. For example, the conductive material 260 of the PTH via 220 extends a plated depth 264, and the conductive material 262 of the PTH via 222 extends a plated depth 266. The plated depth 266 is less than the plated depth 264. The conductive material 262 may only exist in the substrate layer 211, and the conductive material 260 may exist in the substrate layers 211-213.

The PTH vias 220, 222 may also include a drill depth. Drill depths may be measured from the side of the circuit board that received the drill when the conductive material was removed. In FIG. 2, drill depths 268 and 269 are measured from the second side 206. The PTH via 220 has the drill depth 268, and the PTH via 222 has the drill depth 269. The drill depth 269 is greater than the drill depth 268.

The PTH via 220 is directly coupled to a signal trace 290, and the PTH via 222 is directly coupled to a signal trace 292. As used herein, a signal trace is "directly coupled" to a PTH via if the trace extends continuously from the PTH via. The signal trace 290 may be paired with another signal trace (not shown) along a common plane and operate together to transmit differential signals. Likewise, the signal trace 292 may be paired with another signal trace (not shown) to transmit differential signals.

The ground columns 224-226 extend along the z-axis from the first side 204 into the board substrate 202. In an exemplary embodiment, the ground columns 224-226 constitute ground conductors that are located relative to the PTH vias 220, 222 or, more specifically, the signal pairs that include the PTH vias 220, 222. The ground columns 224-226 may be located to reduce crosstalk between the adjacent PTH vias 220, 222 and reduce crosstalk between adjacent signal pairs.

In particular embodiments, the ground columns 224-226 are manufactured using microvia manufacturing processes such as those described above. More specifically, each of the substrate layers 211-214 may undergo microvia processing in which one or more microvias is deposited/formed into the corresponding substrate layer. The ground columns 224-226 comprise one or more of the microvias. The ground columns 224-226 have a column diameter 227 (or microvia diameter), and the PTH vias 220, 222 have a PTH diameter 223. In various embodiments, the column diameter 227 is less than the PTH diameter 223. For example, the column diameter 227 may be less than about 0.40 mm or less than about 0.35 mm. In some embodiments, the column diameter 227 is about 0.30 mm. The PTH diameter 223 may be about 0.5 mm or greater.

The ground columns 224-226 may be manufactured by laser drilling each of the substrate layers 211-214 and forming microvias in the drilled bores before the substrate layers 211-214 are laminated or coupled to one another. The ground columns 224-226 may be formed as the substrate layers 211-214 are stacked relative to each other. In contrast, the PTH vias 220, 222 may be drilled and plated after the substrate layers 211-214 are laminated together.

Also shown in FIG. 2, the circuit board 200 may include ground planes 295-297. The ground planes 295-297 comprise a conductive material (e.g., copper) and are configured to provide an electrical ground for the circuit board 200 and any assembly that uses the circuit board 200. In the illustrated embodiment, the ground planes 295 and 297 are deposited along the first and second sides 204, 206, respectively. The ground plane 296 is deposited between the substrate layers 212, 213. The ground planes 295-297 extend around but do not connect with the conductive material 260, 262 of the PTH vias 220, 222, respectively.

Figure 3:
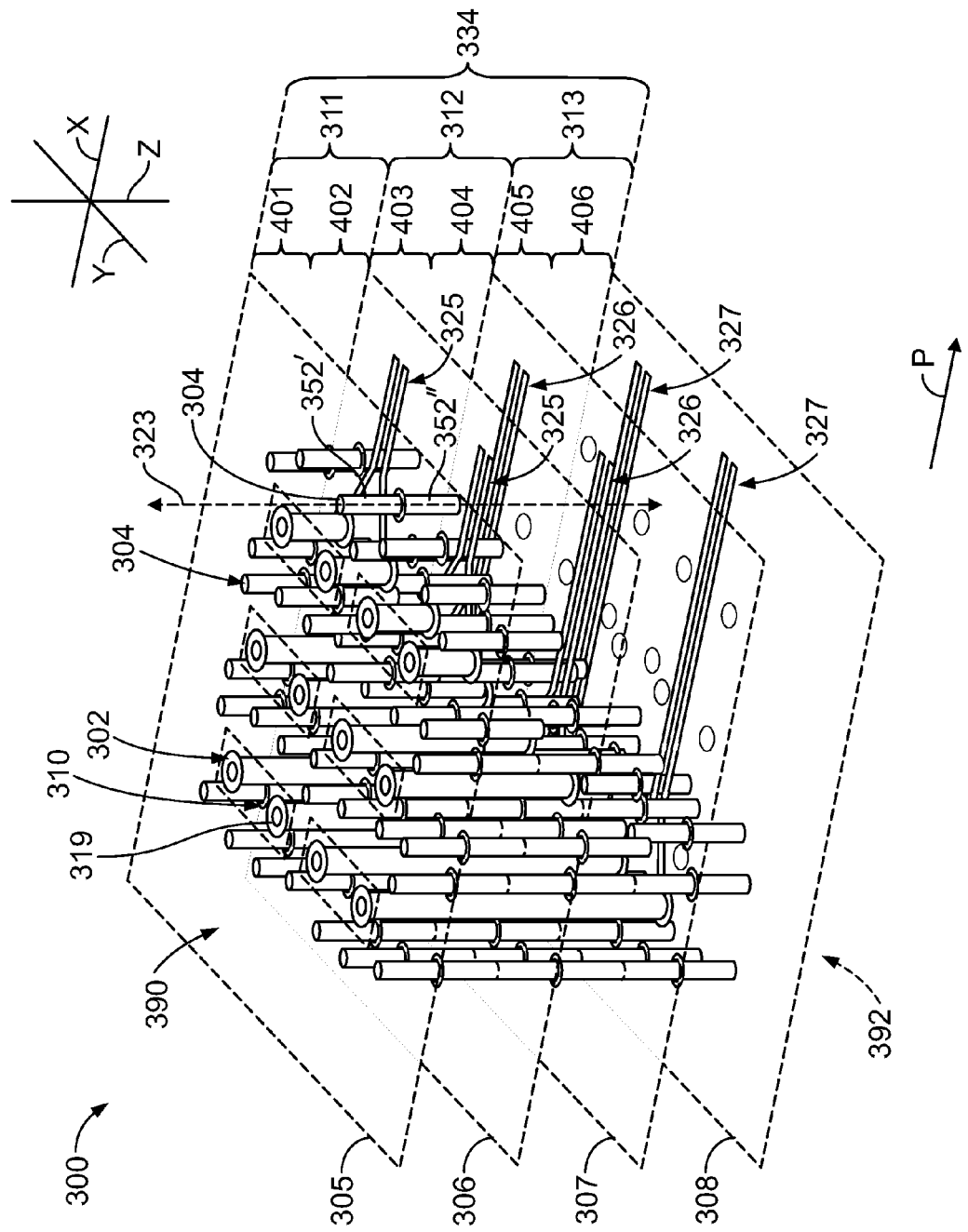
FIG. 3 is a perspective view of a portion of a circuit board formed in accordance with one embodiment.

FIG. 3 is a perspective view of a portion of a circuit board 300 formed in accordance with one embodiment. The circuit board 300 may be similar to the circuit board 200 (FIG. 2) and the circuit boards 106, 108 (FIG. 1) and may be used in conjunction with the connector assemblies 102, 104 (FIG. 1). The circuit board 300 is oriented with respect to mutually perpendicular x-, y-, and z-axes. The circuit board 300 includes opposite first and second sides 390, 392 and a plurality of substrate layers 311-313 extending therebetween. The substrate layers 311-313 are stacked with respect to ground planes 305-308 of the circuit board 300. For illustrative reasons, the dielectric material of the substrate layers 311-313 is not shown. Specifically, the substrate layers 311-313 include a first substrate layer 311 that is located between ground planes 305 and 306; a second substrate layer 312 that is located between ground planes 306 and 307; and a third substrate layer 313 that is located between ground planes 307 and 308. The ground plane 305 extends along the first side 390, and the ground plane 308 extends along the second side 392. The circuit board 300 has a thickness 334 that extends along the z-axis between the first and second sides 390, 392.

In addition to the ground planes 305-308 and the substrate layers 311-313, the circuit board 300 also includes PTH vias 302 and ground columns 304. The PTH vias 302 and the ground columns 304 extend parallel to the z-axis. For illustrative reasons, the ground planes 305-308 are shown with dashed lines, and the PTH vias 302 and the ground columns 304 are illustrated with solid lines. As shown, the ground planes 305-308 extend parallel to a plane defined by the x- and y-axes. The ground planes 305-308 may be directly coupled to the ground columns 304.

The PTH vias 302 are not directly coupled to the ground planes 305-308. The conductive material of the ground planes 305-308 may be removed (e.g., through etching) around the PTH vias 302 along the different substrate layers 311-313. For example, the ground plane 305 may include clearances or antipads 310. The clearances 310 are rectangular in shape in FIG. 3 but may have other shapes in alternative embodiments. Pads 319 of the PTH vias 302 are located in the clearance 310 along the first side 390.

In some embodiments, each of the substrate layers 311-313 may include two or more sub-layers of dielectric material. For example, the substrate layer 311 includes sub-layers 401, 402; the substrate layer 312 includes sub-layers 403, 404; and the substrate layer 313 includes sub-layers 405, 406. In alternative embodiments, one or more of the substrate layers 311-313 include only a single layer. Individual sub-layers (e.g., 401, 402) may be laminated to each other. Each of the sub-layers 401-406 may include separate microvias. For example, the sub-layers 401, 402 include microvias 352', 352", respectively, that are aligned with each other along a common column axis 323 that extends parallel to the z-axis. When the sub-layers of one substrate layer are coupled together, the microvias of the sub-layers may form at least a portion of a ground column. For example, when the sub-layers 401, 402 are coupled together, the microvias 352', 352" may form one of the ground columns 304 as described herein. However, it is noted that alternative ground columns 304 may include only one microvia or more than two microvias.

Also shown in FIG. 3, the substrate layer 311 includes two pairs 325 of signal traces, the substrate layer 312 includes two pairs 326 of signal traces, and the substrate layer 313 includes two pairs 327 of signal traces. The pairs 325 of signal traces in the substrate layer 311 are located between the sub-layers 401, 402. The pairs 326, 327 are also located between the corresponding sub-layers 403, 404, and 405, 406, respectively. It is noted that each of the pairs 325-327 may extend in a common path direction P along the plane defined by the x- and y-axes. For example, in FIG. 3, the pairs 325-327 extend in the path direction P, which is parallel to the x-axis.

Figure 4:
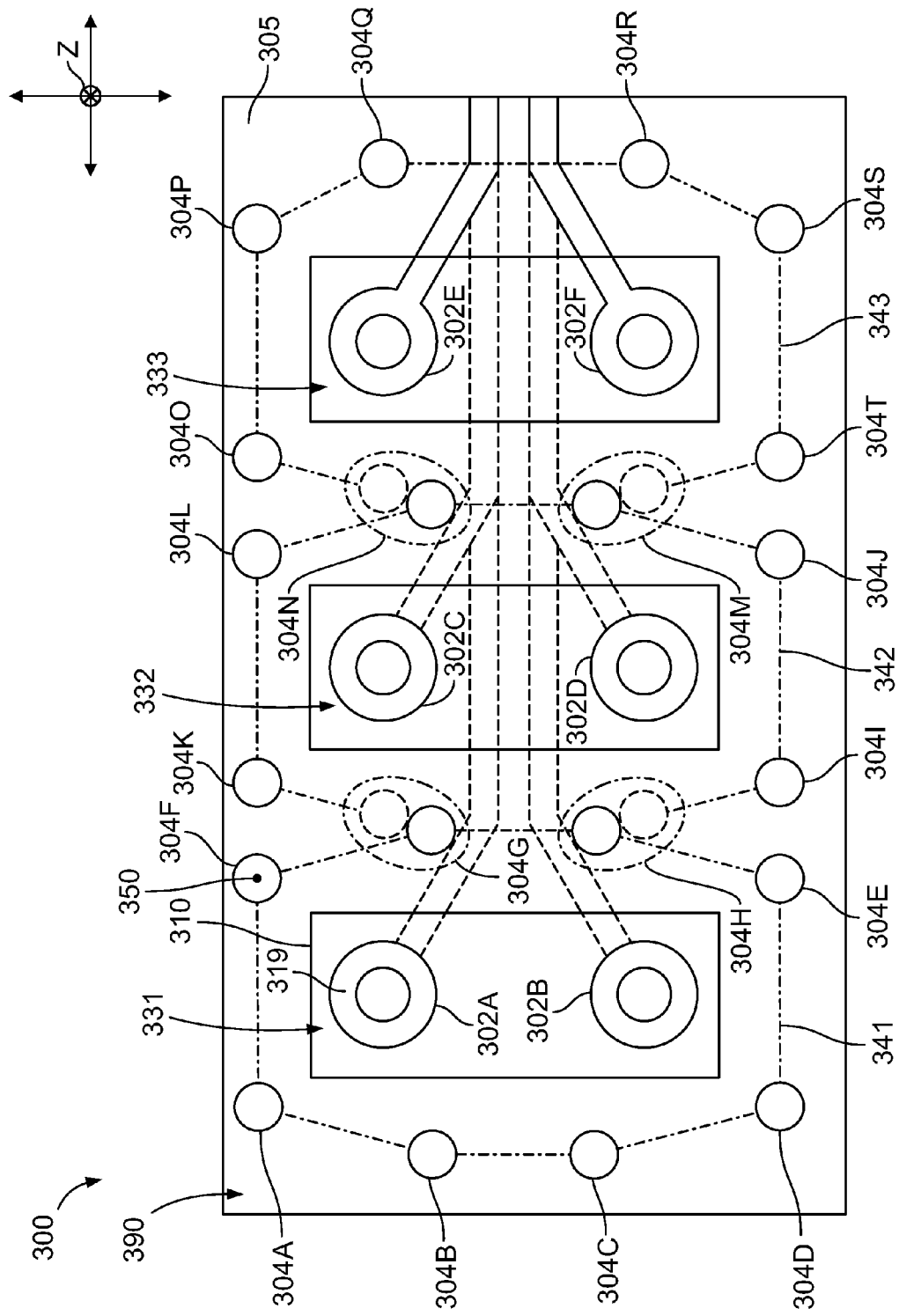
FIG. 4 illustrates a plan view of a portion of the circuit board of FIG. 3 when viewed along a z-axis.

FIG. 4 is a plan view of a portion of the circuit board 300 when viewed along the z-axis. The portion of the circuit board 300 includes PTH vias 302A-302F and ground columns 304A-304T. The PTH vias 302A-302F are arranged to form signal pairs 331-333. More specifically, the signal pair 331 includes the PTH vias 302A, 302B; the signal pair 332 includes the PTH vias 302C, 302D; and the signal pair 333 includes the PTH vias 302E, 302F. Each of the PTH vias 302A-302F includes the pads 319 that are exposed through a corresponding clearance 310 in the ground plane 305. Each of the signal pairs 331-333 extends from the first side 390 into the circuit board 300 along the z-axis.

The ground columns 304A-304T are distributed relative to the signal pairs 331-333 to form shield arrays 341-343. Representative perimeters of the shield arrays 341-343 are indicated by dashed lines that extend between and connect the corresponding ground columns of the shield arrays 341-343. The shield arrays 341-343 are configured to reduce crosstalk experienced by the signal pairs 331-333.

By way of example, the signal pairs 331 and 332 are adjacent signal pairs. As used herein, two signal pairs are adjacent if no other signal pair is located between the two signal pairs. Accordingly, the signal pairs 332 and 333 are also adjacent. The shield arrays 341-343 surround the signal pairs 331-333, respectively. In the illustrated embodiment, each of the shield arrays 341-343 includes eight ground columns. However, alternative configurations of the shield arrays may include fewer or more ground columns.

In particular embodiments, the shield arrays 341-343 may share common ground columns. For example, the shield arrays 341, 342 share the ground columns 304G and 304H. The shield arrays 342, 343 share the ground columns 304N and 304M. In alternative embodiments, the shield arrays 341-343 may not share common ground columns.

The ground columns 304A-304T include at least one microvia. Based on the configuration of the microvia(s) of each ground column, a ground column may be characterized as a linear column or a disjointed column. Linear columns include a series of microvias that are aligned along a common axis. The microvias of the linear columns are stacked end-to-end. By way of example, the ground column 304F is a linear column that includes a plurality of the microvias that are aligned along a common axis 350. However, as will be described below, disjointed columns include a plurality of microvias in which at least one of the microvias is not aligned with the other microvia(s). In the illustrated embodiment of FIGS. 3-8, the ground columns 304A-304F, 304I-304L, and 304O-304T are linear columns, and the ground columns 304G, 304H, 304N, and 304M are disjointed columns. In an exemplary embodiment, the disjointed columns are also common ground columns that are shared by different shield arrays.

Figure 5:
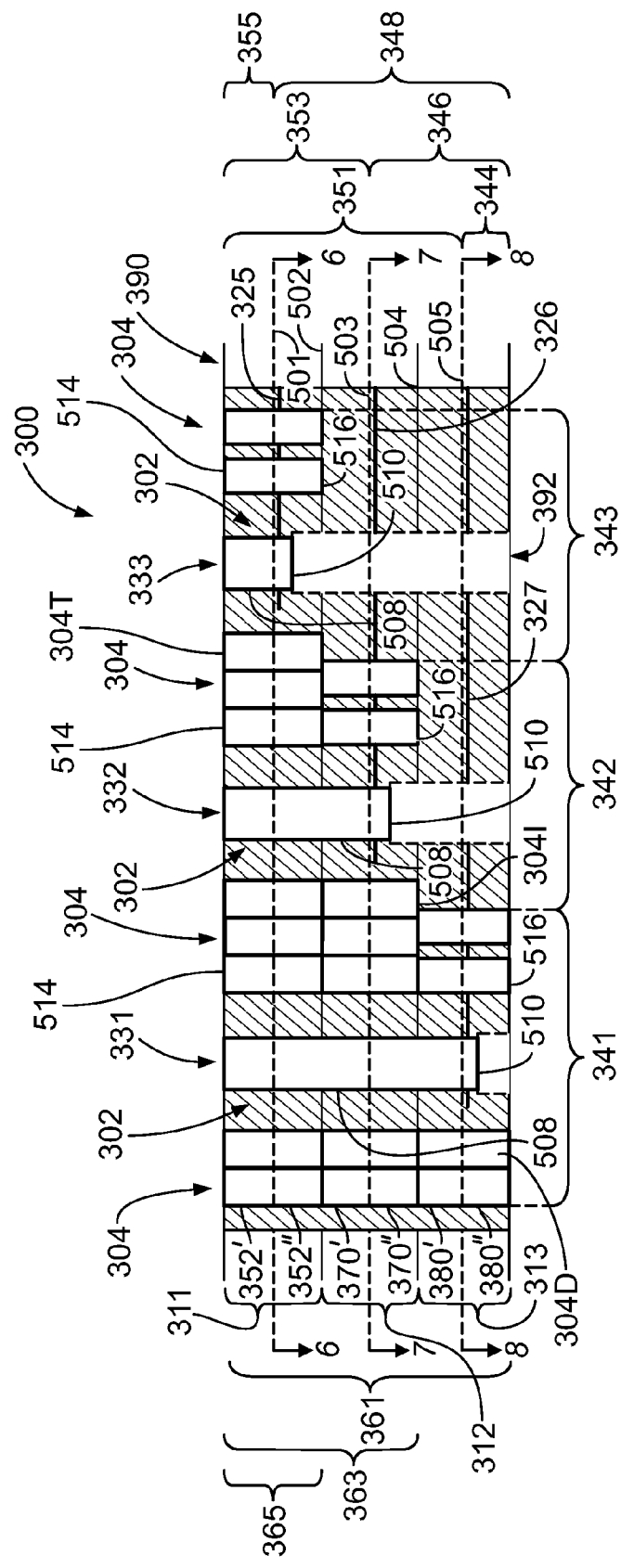
FIG. 5 is a side view of plated thru-hole (PTH) vias and ground columns in the circuit board of FIG. 3.

FIG. 5 is a side view of the PTH vias and the ground columns in the circuit board 300. For clarity in FIG. 5, the PTH vias of the signal pairs 331-333 are referenced generally as 302 unless otherwise noted and the ground columns of the shield arrays 341-343 are referenced generally as 304 unless otherwise noted. Also, for illustrative purposes in FIG. 5, dielectric material of the substrate layers 311-313 is indicated with cross-hatching to more easily identify the PTH vias 302, the ground columns 304, and the pairs 325-327 of the signal traces.

The PTH vias 302 may be back-drilled from the second side 392 to reduce a depth in which the PTH vias 302 are plated. For example, the PTH vias 302 of the signal pair 331 have a plated depth 351 that extends from the first side 390 and a drill depth 344 that extends from the second side 392; the PTH vias 302 of the signal pair 332 have a plated depth 353 that extends from the first side 390 and a drill depth 346 that extends from the second side 392; the PTH vias 302 of the signal pair 333 have a plated depth 355 that extends from the first side 390 and a drill depth 348 that extends from the second side 392. In the illustrated embodiment, each of the pairs 325-327 of signal traces is disposed at a trace depth that is substantially equal to the plated depths 355, 353, and 351, respectively. Each of the PTH vias 302 has a plated portion 508 that extends from the first side 390 to a corresponding plated end 510.

In an exemplary embodiment, the signal traces 325-327 extend along different internal levels of the circuit board 302. In some embodiments, the different levels are defined along interfaces between adjacent substrate layers or sub-layers of the substrate layers. For example, as shown in FIG. 5, the circuit board 300 (or the board substrate of the circuit board 300) may have internal levels 501-505. More specifically, the internal level 501 is located between the sub-layers 401, 402 (shown in FIG. 3) of the substrate layer 311; the internal level 502 is located between the substrate layers 311, 312; the internal level 503 is located between the sub-layers 403, 404 (shown in FIG. 3) of the substrate layer 312; the internal level 504 is located between the substrate layers 312, 313; and the internal level 505 is located between the sub-layers 405, 406 (shown in FIG. 3) of the substrate layer 313. Thus, the signal traces 325, 326, and 327 extend along internal levels 1, 3, and 5, respectively. Each internal level has a depth located relative to the first side 390 and extends parallel to the first and second sides 390, 392. As shown, the plated ends 510 of the PTH vias 302 may be located proximate to different internal levels.

Also shown, the ground columns 304 may extend to varying depths in the circuit board 300. Each of the ground columns 304 extends from a first column end 514 to a second column end 516. In the illustrated embodiment, the first column ends 514 are located at the first side 390 and the second column ends 516 are located at the second side 392 or at different internal levels of the circuit board 300. For example, the ground columns 304 that form the shield array 341 may surround the signal pair 331 and extend to a common column depth 361. The column depth 361 for each of the ground columns 304 that form the shield array 341 may be measured from the corresponding first column end 514 at the first side 390 to the corresponding second column end 516 at the second side 392. The ground columns 304 of the shield array 342 may extend to a common column depth 363. The column depth 363 for each of the ground columns 304 that form the shield array 342 may be measured from the corresponding first column end 514 at the first side 390 to the corresponding second column end 516 at the internal level 504. The ground columns 304 of the shield array 343 may extend to a common column depth 365. The column depth 365 for each of the ground columns 304 that form the shield array 343 may be measured from the corresponding first column end 514 at the first side 390 to the corresponding second column end 516 at the internal level 502. In the illustrated embodiment, each of the column depths 361, 363, and 365 is greater than the plated depths 351, 353, and 355, respectively.

Each of the substrate layers 311-313 includes two sub-layers that have microvias extending through an entire thickness of the corresponding sub-layer. In particular, the substrate layer 311 includes microvias 352', 352"; the substrate layer 312 includes 370', 370"; and the substrate layer 313 includes 380', 380". By way of example, the ground column 304D of the shield array 341 has six microvias 352', 352", 370', 370", 380', 380"; the ground column 304I of the shield array 342 may have four microvias 352', 352", 370', 370"; and the ground column 304T of the shield array 343 may have two microvias 352', 352".

Embodiments described herein may have plated depths (or drill depths) and column depths that are configured to permit routing of the signal traces in a desired manner. At least some signal traces may extend along an internal level that is located between one side of the circuit board 300 and at least another internal level(s) where plated ends of PTH vias and second column ends of ground columns are approximately located. In other words, the signal traces directly coupled to one signal pair may extend along an internal level of the circuit board 300 that is between the plated ends of other signal pairs and the second column ends of shield arrays that surround the other signal pairs.

By way of example, the signal traces 327, which are directly coupled to the signal pair 331, extend along the level 505. The plated ends 510 of the signal pair 332 and the second column ends 516 of the shield array 342 are approximately located at the levels 503 and 504, respectively. The level 505 extends between the second side 392 and the levels 503, 504. As another example, the signal traces 326, which are directly coupled to the signal pair 332, extend along the level 503. The plated ends 510 of the signal pair 333 and the second column ends 516 of the shield array 343 are approximately located at the levels 501 and 502, respectively. The level 503 extends between the second side 392 and the levels 501, 502. The level 505 also extends between the second side 392 and the levels 501, 502. Accordingly embodiments may have plated portions 508 and ground columns 304 that are configured to permit routing of the signal traces in a desired manner.

Figure 6:
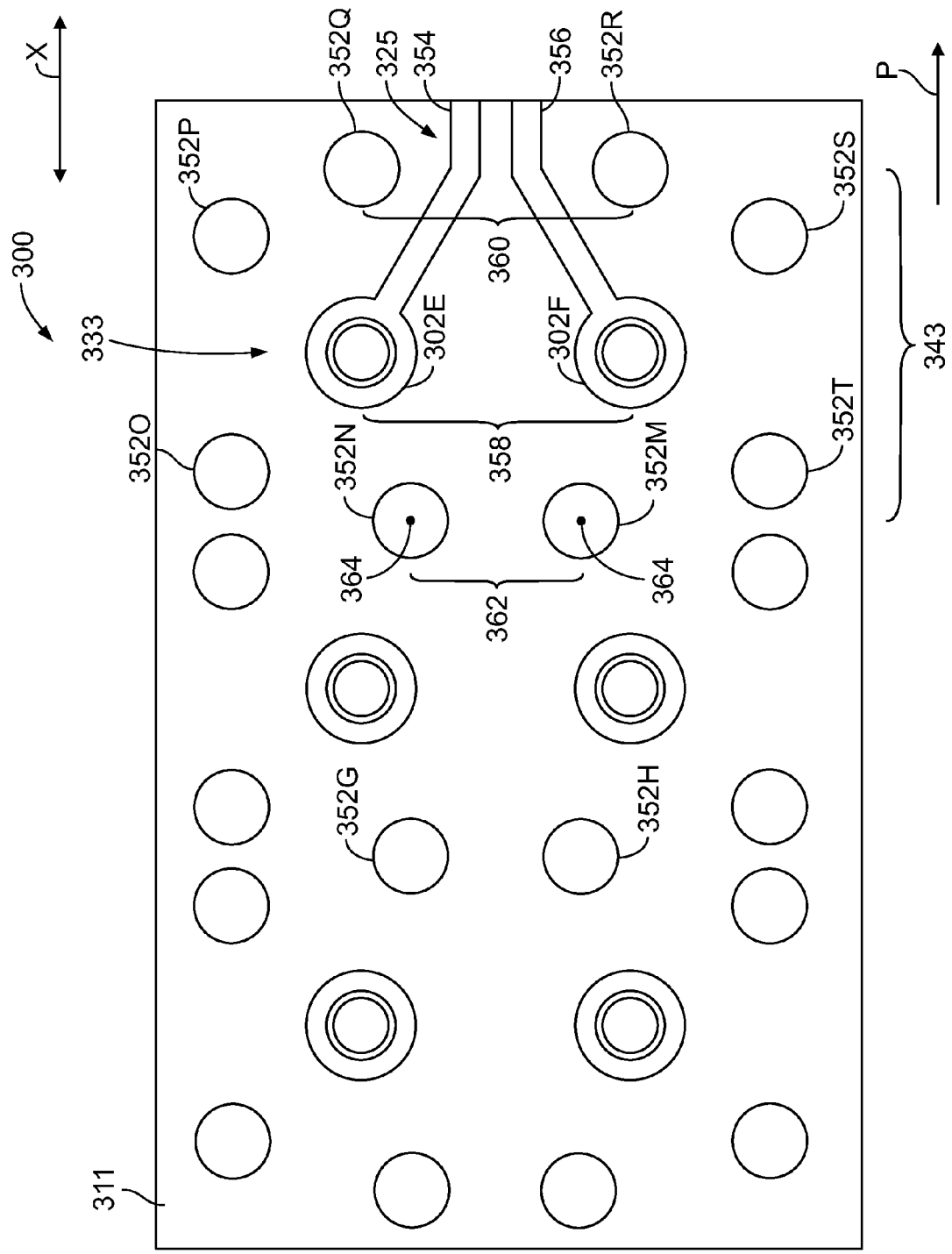
FIG. 6 illustrates a cross-section of the circuit board taken along the line 6-6 in FIG. 5.
Figure 7:
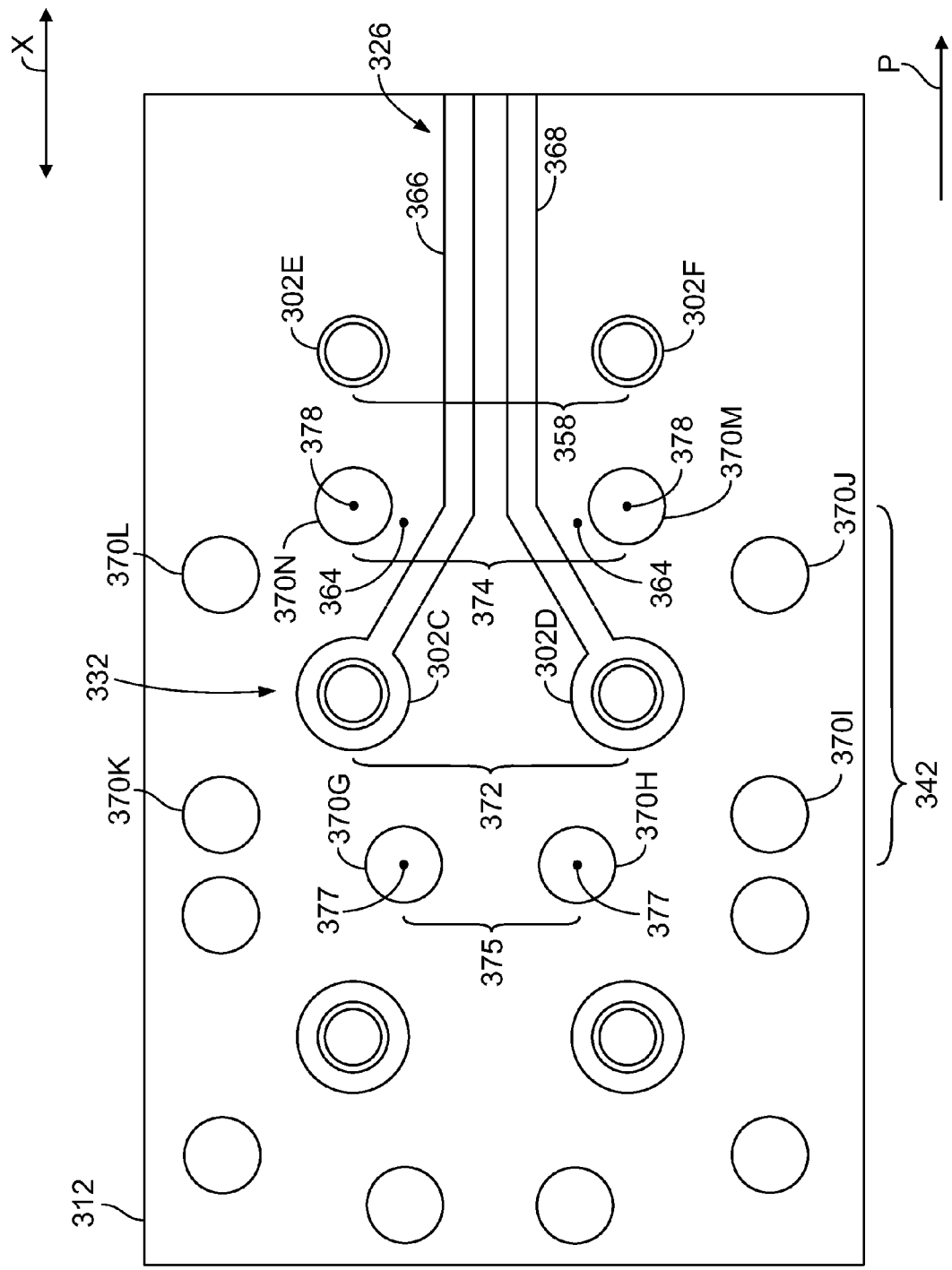
FIG. 7 illustrates a cross-section of the circuit board taken along the line 7-7 in FIG. 5.
Figure 8:
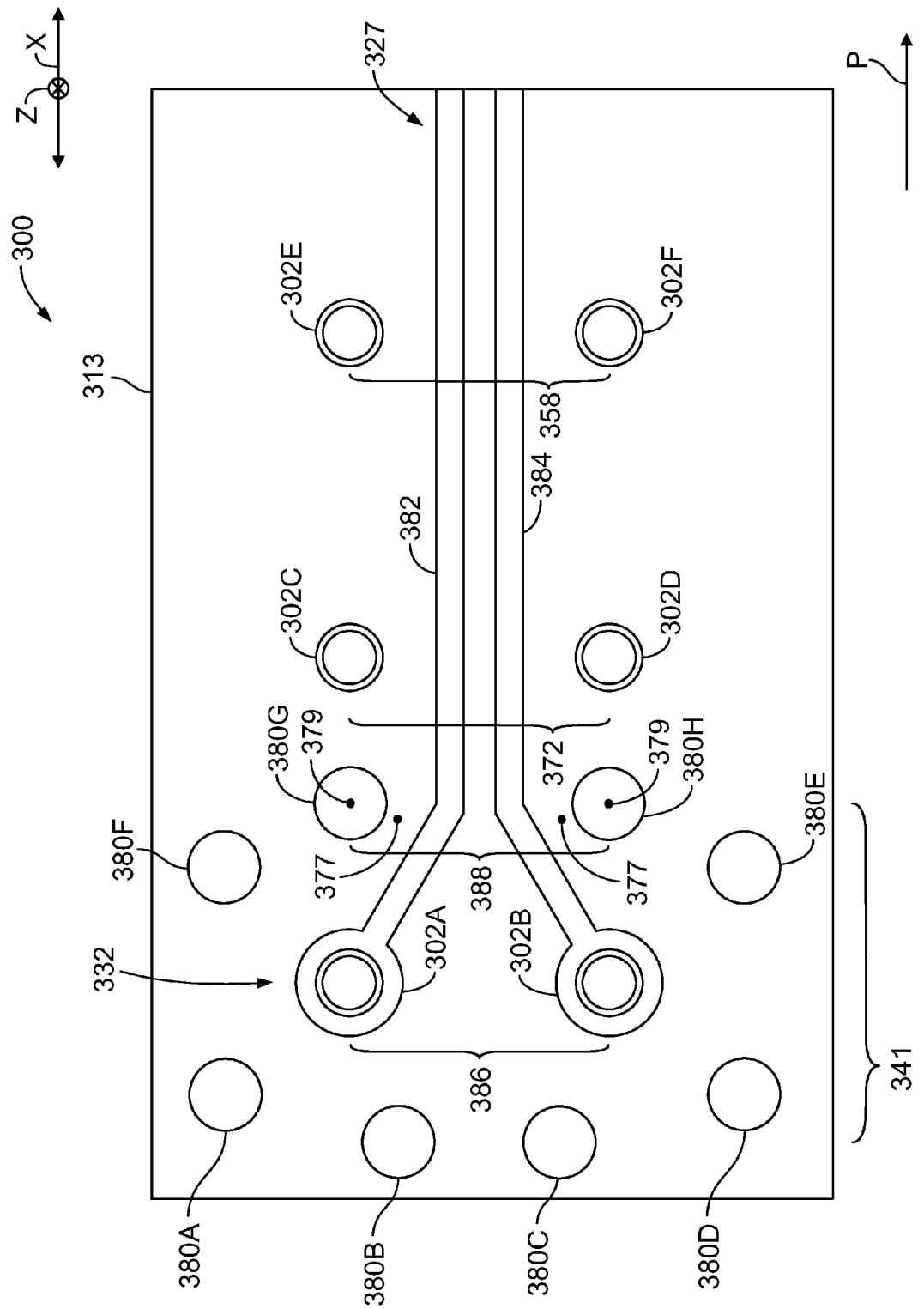
FIG. 8 illustrates a cross-section of the circuit board taken along the line 8-8 in FIG. 5.

FIGS. 6, 7, and 8 show different cross-sections of the circuit board 300 taken along the lines 6-6, 7-7, and 8-8, respectively, in FIG. 5. FIGS. 6, 7, and 8 are taken approximately through the middle of the substrate layers 311-313, respectively. For example, FIG. 6 is taken along the interface between the two sub-layers 401, 402 (FIG. 3). Collectively, FIGS. 6, 7, and 8 illustrate how the conductive elements (e.g., the PTH vias, microvias, and signal traces) of the circuit board 300 are spatially arranged with respect to one another.

FIG. 6 shows microvias 352M-352T of the ground columns 304M-304T (FIG. 4), respectively, which at least partially define the shield array 343. The microvias 352M-352T are formed in the substrate layer 311 and may be electrically coupled to, at the very least, the ground planes 305, 306 (FIG. 3). The microvias 352M-352T may be formed in the substrate layer 311 before the substrate layer 311 is coupled (e.g., laminated) with the other substrate layers 312, 313 (FIG. 3). The pair 325 of traces includes signal traces 354, 356 that are directly coupled to the PTH vias 302E, 302F, respectively, of the signal pair 333. The PTH vias 302E, 302F have a center-to-center separation distance 358.

The microvias 352Q and 352R have a center-to-center separation distance 360 that is substantially equal to the separation distance 358. Initially, the signal traces 354, 356 extend from the corresponding PTH vias 302E, 302F in directions that are non-orthogonal to the x-axis. More specifically, the signal traces 354, 356 extend in directions that converge toward each other along the path direction P. When the signal traces 354, 356 reach a location that is between the microvias 352Q, 352R, the signal traces 354, 356 turn and extend parallel to the x-axis (e.g., in the path direction P).

Also shown in FIG. 6, the microvias 352M, 352N have a center-to-center separation distance 362, which is less than the separation distances 358 and 360. Each of the microvias 352M, 352N extends along a first column axis 364.

In FIG. 7, the substrate layer 312 includes microvias 370G-370N, which at least partially define the shield array 342. The microvias 370G-370N may be electrically coupled to, at the very least, the ground planes 306, 307 (FIG. 3). The pair 326 includes signal traces 366, 368 that are directly coupled to the PTH vias 302C, 302D, respectively, of the signal pair 332. The PTH vias 302C, 302D have a center-to-center separation distance 372, which is substantially equal to the separation distance 358 between the PTH vias 302E, 302F. Like the signal traces 354, 356 (FIG. 6), the signal traces 366, 368 extend from the corresponding PTH vias 302C, 302D in directions that are non-orthogonal to the x-axis. More specifically, the signal traces 366, 368 extend in directions that converge toward each other along the path direction P. When the signal traces 366, 368 reach a location that is between the microvias 370M, 370N, the signal traces 366, 368 turn and extend parallel to the x-axis (e.g., in the path direction P).

The microvias 370M, 370N have a center-to-center separation distance 374, which is greater than the separation distance 362 (FIG. 6) between the microvias 352M, 352N. Also shown in FIG. 7, the microvias 370M, 370N have a second column axis 378. The first column axis 364 and the second column axis 378 are proximate to each other (e.g., less than about 0.5 mm apart), but do not coincide. Accordingly, the ground column 304M (FIG. 4) is a disjointed column that includes the microvia 352M in the substrate layer 311 (FIG. 6) and the microvia 370M in the substrate layer 312. The ground column 304N (FIG. 4) is also a disjointed column that includes the microvia 352N in the substrate layer 311 and the microvia 370N in the substrate layer 312.

Also shown in FIG. 7, the microvias 370G, 370H have a center-to-center separation distance 375. Each of the microvias 370G, 370H extends along a first column axis 377. Each of the microvias 370G, 370H is stacked end-to-end with the microvias 352G, 352H (FIG. 6), respectively, in the substrate layer 311 (FIG. 6). The stacked microvias 370G, 352G are aligned along the associated first column axis 377 in FIG. 7, and the stacked microvias 370H, 352H are also aligned along the associated first column axis 377. Also shown, the PTH vias 302E and 302F are back-drilled in the substrate layer 312. The signal traces 366, 368 extend between the PTH vias 302E and 302F. As such, the signal traces 366, 368 do not extend between the conductive materials of the PTH vias 302E, 302F.

In an exemplary embodiment, the signal traces 366, 368 extend underneath the shield array 343 (FIG. 6). For example, the signal traces 366, 368 may intersect a vertical space that extends between the first and second sides 390, 392 (FIG. 5) and occupies the shield array 343.

In FIG. 8, the substrate layer 313 includes microvias 380A-380H, which at least partially define the shield array 341. The microvias 380A-380H may be electrically coupled to, at the very least, the ground planes 307, 308 (FIG. 3). The pair 327 includes signal traces 382, 384 that are directly coupled to the PTH vias 302A, 302B, respectively, of the signal pair 332. The PTH vias 302A, 302B have a center-to-center separation distance 386, which is substantially equal to the separation distance 358 between the PTH vias 302E, 302F and the separation distance 372 between the PTH vias 302C, 302D. Like the signal traces 354, 356 (FIG. 6) and the signal traces 366, 368 (FIG. 7), the signal traces 382, 384 extend from the corresponding PTH vias 302A, 302B in directions that are non-orthogonal to the x-axis. More specifically, the signal traces 382, 384 extend in directions that converge toward each other along the path direction P. When the signal traces 382, 384 reach a location that is between the microvias 380G, 380H, the signal traces 382, 384 turn and extend parallel to the x-axis (e.g., in the path direction P).

The microvias 380G, 380H have a center-to-center separation distance 388, which is greater than the separation distance 375 (FIG. 7) between the microvias 370G, 370H. In addition, the microvias 380G, 380II have a second column axis 379. As shown in FIG. 8, the first column axis 377 and the second column axis 379 are proximate to each other, but do not coincide. Accordingly, the ground column 304G (FIG. 4) is a disjointed column that includes the microvias 352G (FIG. 6), 370G (FIG. 7), and 380G. The ground column 304H (FIG. 4) is a disjointed column that includes the microvias 352H (FIG. 6), 370H (FIG. 7), and 380H.

In addition to the PTH vias 302E, 302F, the PTH vias 302C, 302D are back-drilled in the substrate layer 313. The signal traces 382, 384 extend between non-plated portions of the PTH vias 302C, 302D and the PTH vias 302E, 302F. As such, the signal traces 382, 384 do not extend between the conductive materials of the PTH vias 302C-302F.

In the illustrated embodiment, the signal traces 354, 356 (FIG. 6) of the pair 325 (FIG. 6), the signal traces 366, 368 (FIG. 7) of the pair 326 (FIG. 7), and the signal traces 382, 384 of the pair 327 are aligned with one another along the z-axis throughout the portion of the circuit board 300 shown in FIGS. 3-8. Moreover, the signal traces 382, 384 extend underneath the shield arrays 342, 343. For example, the signal traces 382, 384 may intersect a vertical space that extends between the first and second sides 390, 392 and occupies the shield array 342. The signal traces 382, 384 may also intersect a vertical space that extends between the first and second sides 390, 392 and occupies the shield array 343.

Accordingly, each of the substrate layers has a corresponding array configuration of microvias. For example, the substrate layer 311 has a first array configuration of microvias 352 as shown in FIG. 6. The substrate layer 312 has a second array configuration of microvias 370 as shown in FIG. 7, and the substrate layer 313 has a third array configuration of microvias 380 as shown in FIG. 8. The first, second, and third array configurations may be different based on a total number of microvias in the array configurations and/or positioning of the microvias in the array configurations. For example, the substrate layer 313 has fewer microvias than the substrate layer 312, and the microvias 380G, 380H in the substrate layer 313 have different relative positions with respect to the microvias 370G, 370H in the substrate layer 312.

The following describes embodiments and/or aspects supported by the above description and refers to exemplary elements that were described and illustrated with respect to FIGS. 1-8. However, it is understood that many other embodiments and modifications within the spirit and scope of the claims will be apparent to those of skill in the art upon reviewing the above description.

For example, in one or more embodiments, a circuit board (e.g., 200) is provided that may include a board substrate (e.g., 202) having opposite first and second sides (e.g., 390, 392). The board substrate may have a thickness (e.g., 334) that is measured along a z-axis that is perpendicular to the first and second sides. The circuit board may also include plated thru-hole (PTH) vias (e.g., 302A-302F) that extend along the z-axis from the first side into the board substrate. The PTH vias may be arranged to form multiple signal pairs (e.g., 331-333). The circuit board may also include signal traces (e.g., 354, 356, 366, 368, 382, 384) that are directly coupled to the PTH vias and extend perpendicular to the z-axis in the board substrate. The signal traces and the PTH vias are configured to transmit differential signals. The circuit board may also include ground columns (e.g., 304A-304T) that extend along the z-axis in the board substrate. The ground columns may be distributed relative to the signal pairs to form shield arrays (e.g., 341-343). Each of the shield arrays surrounds one of the signal pairs, wherein the ground columns comprise microvias (e.g., 352, 370, 380).

The shield arrays may include first and second shield arrays (e.g., 341, 342). The ground columns (e.g., 304A-304H) of the first shield array extend a first column depth (e.g., 361) into the board substrate from the first side. The ground columns of the second shield array extend a second column depth (e.g., 363) into the board substrate. The first and second column depths may be different.

The signal pairs may include first and second signal pairs (e.g., 331, 332, respectively) that are surrounded by the first and second shield arrays (e.g., 341, 342), respectively. The board substrate includes first and second internal levels (e.g., 505, 503) that are located between the first and second sides (e.g., 390, 392). The PTH vias of the second signal pair have plated portions (e.g., 508) that extend from the first side (e.g., 390) to the second internal level (e.g., 503). The signal traces (e.g., 382, 384) that are directly coupled to the first signal pair may extend along the first internal level, wherein the first internal level extends between the second side and the second internal level.

The shield arrays may include first and second shield arrays (e.g., 341, 342). The ground columns (e.g., 304A-304H) of the first shield array are formed from corresponding microvias (e.g., 352, 370, 380) that are stacked end-to-end.

The board substrate (e.g., 202) may include first and second substrate layers (e.g., 311, 312) that are stacked one on the other. The microvias may include first microvias (e.g., 352) and second microvias (e.g., 370). The first microvias are formed in the first substrate layer, and the second microvias are formed in the second substrate layer. At least some of the ground columns (e.g., 304G-304N) include one of the first microvias stacked end-to-end with one of the second microvias. In another aspect, the first microvias may be in a first array configuration in the first substrate layer, and the second microvias may be in a different second array configuration in the second substrate layer.

The ground columns (e.g., 304A-304H) of at least one shield array (e.g., 341) include a linear column (e.g., 304F) and a disjointed column (e.g., 304G). The linear column includes a plurality of the microvias (e.g., 352, 370, 380) that are aligned along a common axis (e.g., 350). The disjointed column includes a plurality of the microvias (e.g., 352, 370, 380), wherein one of the microvias (e.g., 370) of the disjointed column is aligned along a first axis (e.g., 377) and another microvia (e.g., 380) of the disjointed column is aligned along a different second axis (e.g., 379). The first and second axes may be proximate to each other.

In another aspect, the signal pairs include first and second signal pairs (e.g., 331, 332) that are adjacent to each other. The signal traces (e.g., 382, 384) that are directly coupled to the first signal pair are disposed at a first trace depth (e.g., 351). The signal traces (e.g., 366, 368) that are directly coupled to the second signal pair are disposed at a second trace depth (e.g., 353). The first and second trace depths are different.

In another aspect, the signal traces (e.g., 382, 384, 366, 368) that are directly coupled to the first and second signal pairs (e.g., 331, 332) may extend in a common direction along a plane defined by x- and y-axes that are perpendicular to the z-axis.

The signal pairs may include first and second signal pairs (e.g., 331, 332). The PTH vias (e.g., 302A, 302B) of the first signal pair may be back-drilled to a first drill depth (e.g., 344). The PTH vias (e.g., 302C, 302D) of the second signal pair may be back-drilled to a second drill depth (e.g., 346). The first and second drill depths are different.

In another aspect, the signal pairs include first and second signal pairs (e.g., 331, 332). The PTH vias (e.g., 302A, 302B)

of the first signal pair include conductive material that extends to a first plated depth (e.g., 351). The PTH vias (e.g., 302C, 302D) of the second signal pair include conductive material that extends to a second plated depth (e.g., 353). The first and second plated depths may be different.

In another aspect, the signal pairs include first and second signal pairs (e.g., 331, 332), and the shield arrays include first and second shield arrays (e.g., 341, 342) that surround the first and second signal pairs, respectively. The first and second shield arrays may share at least one common ground column (e.g., 304G, 304H).

In one or more embodiments, a backplane connector system (e.g., 100) may be provided that includes an electrical connector (e.g., 102) having a mounting side (e.g., 110) that includes an array of electrical contacts (e.g., 280, 282). The connector system may include a circuit board (e.g., 200) having opposite first and second sides (e.g., 390, 392). The circuit board has a thickness (e.g., 334) that is measured along a z-axis that is perpendicular to the first and second sides. The circuit board may be similar to the other circuit boards (e.g., 106, 108, 200, 300) described herein.

In one aspect, the circuit board is one of a backplane circuit board or a daughter card, and the connector assembly is configured to have a data transfer rate of at least about 10 Gb/s.

As used herein, an element or step recited in the singular and proceeded with the word "a" or "an" should be understood as not excluding plural of said elements or steps, unless such exclusion is explicitly stated. Furthermore, references to "one embodiment" or "an embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A circuit board comprising:
    a board substrate having opposite first and second sides, the board substrate having a thickness measured along a z-axis that is perpendicular to the first and second sides;
    plated thru-hole (PTH) vias extending along the z-axis from the first side into the board substrate, the PTH vias arranged to form multiple signal pairs;
    signal traces directly coupled to the PTH vias and extending perpendicular to the z-axis in the board substrate, wherein the signal traces and the PTH vias are configured to transmit differential signals; and
    ground columns extending along the z-axis in the board substrate, the ground columns being distributed relative to the signal pairs to form shield arrays, each of the shield arrays surrounding one of the signal pairs, wherein the ground columns comprise microvias.

2. The circuit board of claim 1, wherein the shield arrays include first and second shield arrays, the ground columns of the first shield array extending a first column depth into the board substrate from the first side, the ground columns of the second shield array extending a second column depth into the board substrate, wherein the first and second column depths are different.

3. The circuit board of claim 2, wherein the signal pairs include first and second signal pairs that are surrounded by the first and second shield arrays, respectively, the board substrate having first and second internal levels that are located between the first and second sides, the PTH vias of the second signal pair having plated portions that extend from the first side to the second internal level, the signal traces that are directly coupled to the first signal pair extending along the first internal level, wherein the first internal level extends between the second side and the second internal level.

4. The circuit board of claim 1, wherein the shield arrays include first and second shield arrays, the ground columns of the first shield array being formed from corresponding microvias that are stacked end-to-end.

5. The circuit board of claim 1, wherein the board substrate includes first and second substrate layers stacked alongside each other and the microvias include first microvias and second microvias, the first microvias being formed in the first substrate layer and the second microvias being formed in the second substrate layer, wherein at least some of the ground columns include one of the first microvias stacked end-to-end with one of the second microvias.

6. The circuit board of claim 1, wherein the board substrate includes first and second substrate layers stacked one on the other and the microvias include first microvias and second microvias, the first microvias being formed in the first substrate layer and the second microvias being formed in the second substrate layer, wherein the first microvias are in a first array configuration and the second microvias are in a different second array configuration.

7. The circuit board of claim 1, wherein the ground columns of at least one shield array include a linear column and a disjointed column, the linear column including a plurality of the microvias aligned along a common axis, the disjointed column including a plurality of the microvias, wherein one of the microvias of the disjointed column is aligned along a first axis and another microvia of the disjointed column is aligned along a different second axis, the first and second axes being proximate to each other.

8. The circuit board of claim 1, wherein the signal pairs include first and second signal pairs that are adjacent to each other, the signal traces that are directly coupled to the first signal pair are disposed at a first trace depth, the signal traces that are directly coupled to the second signal pair are disposed at a second trace depth, wherein the first and second trace depths are different.

9. The circuit board of claim 8, wherein the circuit board is oriented with respect to x- and y-axes that extend perpendicular to each other and to the z-axis, the signal traces that are directly coupled to the first and second signal pairs extending in a common direction along a plane defined by the x- and y-axes.

10. The circuit board of claim 1, wherein the signal pairs include first and second signal pairs, the PTH vias of the first signal pair being back-drilled to a first drill depth, the PTH vias of the second signal pair being back-drilled to a second drill depth, wherein the first and second drill depths are different.

11. The circuit board of claim 1, wherein the signal pairs include first and second signal pairs, the PTH vias of the first signal pair including conductive material that extends to a first plated depth, the PTH vias of the second signal pair including conductive material that extends to a second plated depth, the first and second plated depths being different.

12. The circuit board of claim 1, wherein the signal pairs include first and second signal pairs and the shield arrays include first and second shield arrays that surround the first and second signal pairs, respectively, wherein the first and second shield arrays share at least one common ground column.

13. A backplane connector system comprising:
an electrical connector assembly having a mounting side that includes an array of electrical contacts; and
a circuit board having opposite first and second sides, the circuit board having a thickness measured along a z-axis that is perpendicular to the first and second sides, the circuit board comprising:
plated thru-hole (PTH) vias extending along the z-axis from the first side into the circuit board, the PTH vias arranged to form multiple signal pairs, the electrical contacts mechanically and electrically engaging the PTH vias;
signal traces directly coupled to the PTH vias and extending perpendicular to the z-axis in the circuit board, wherein the signal traces and the PTH vias are configured to transmit differential signals; and
ground columns extending along the z-axis in the circuit board, the ground columns being distributed relative to the signal pairs to form shield arrays, each of the shield arrays surrounding one of the signal pairs, wherein the ground columns comprise microvias.

14. The connector system of claim 13, wherein the shield arrays include first and second shield arrays, the ground columns of the first shield array extending a first column depth into the board substrate from the first side, the ground columns of the second shield array extending a second column depth into the board substrate, wherein the first and second column depths are different.

15. The connector system of claim 13, wherein the shield arrays include first and second shield arrays, the ground columns of the first shield array being formed from corresponding microvias that are stacked end-to-end.

16. The connector system of claim 13, wherein the board substrate includes first and second substrate layers stacked one on the other and the microvias include first microvias and second microvias, the first microvias being formed in the first substrate layer and the second microvias being formed in the second substrate layer, wherein at least some of the ground columns include one of the first microvias stacked end-to-end with one of the second microvias.

17. The connector system of claim 13, wherein the board substrate includes first and second substrate layers stacked one on the other and the microvias include first microvias and second microvias, the first microvias being formed in the first substrate layer and the second microvias being formed in the second substrate layer, wherein at least one of the shield arrays includes the first microvias being in a first array configuration and the second microvias being in a different second array configuration.

18. The connector system of claim 13, wherein the ground columns of at least one shield array include a linear column and a disjointed column, the linear column including a plurality of the microvias aligned along a common axis, the disjointed column including a plurality of the microvias, wherein one of the microvias of the disjointed column is aligned along a first axis and another microvia of the disjointed column is aligned along a different second axis, the first and second axes being proximate to each other.

19. The connector system of claim 13, wherein the signal pairs include first and second signal pairs that are adjacent to each other, the signal traces that are directly coupled to the first signal pair are disposed at a first trace depth, the signal traces that are directly coupled to the second signal pair are disposed at a second trace depth, wherein the first and second trace depths are different.

20. The connector system of claim 13, wherein the circuit board is one of a backplane circuit board or a daughter card and the connector assembly is configured to have a data transfer rate of at least about 10 Gb/s.

* * * * *